US011643763B2

(12) United States Patent
Sen et al.

(10) Patent No.: US 11,643,763 B2
(45) Date of Patent: May 9, 2023

(54) SCALABLE NANOTUBE FABRICS AND METHODS FOR MAKING SAME

(71) Applicant: ZEON CORPORATION, Tokyo (JP)

(72) Inventors: Rahul Sen, Lexington, MA (US); Billy Smith, Woburn, MA (US); J. Thomas Kocab, Exeter, RI (US); Ramesh Sivarajan, Shrewsbury, MA (US); Peter Sites, Marblehead, MA (US); Thomas Rueckes, Byfield, MA (US); David A. Roberts, Woburn, MA (US)

(73) Assignee: ZEON CORPORATION, Tokyo (JP)

( * ) Notice: Subject to any disclaimer, the term of this patent is extended or adjusted under 35 U.S.C. 154(b) by 301 days.

(21) Appl. No.: 16/866,912

(22) Filed: May 5, 2020

(65) Prior Publication Data
US 2020/0262701 A1 Aug. 20, 2020

Related U.S. Application Data

(63) Continuation of application No. 14/033,158, filed on Sep. 20, 2013, now Pat. No. 10,654,718.

(51) Int. Cl.
*B82Y 30/00* (2011.01)
*C01B 32/176* (2017.01)
*B82Y 40/00* (2011.01)
*D04H 1/4242* (2012.01)
*D04H 1/732* (2012.01)
(Continued)

(52) U.S. Cl.
CPC ............ *D04H 1/4242* (2013.01); *B82Y 30/00* (2013.01); *B82Y 40/00* (2013.01); *C01B 32/176* (2017.08); *D04H 1/732* (2013.01);

*D21H 13/50* (2013.01); *D21H 15/02* (2013.01); *D21H 21/52* (2013.01); *H01H 1/0094* (2013.01); *G11C 13/025* (2013.01); *H01L 23/53276* (2013.01);
(Continued)

(58) Field of Classification Search
CPC .................. C01B 32/176; C01B 32/28; Y10T 428/249921; H01L 23/53276; H01L 2924/0002; G11C 13/025; H01H 1/0094; D21H 13/50; D21H 15/02; D21H 21/52; D04H 1/4242; D04H 1/732; B82Y 30/00
See application file for complete search history.

(56) References Cited

U.S. PATENT DOCUMENTS 6,723,299 B1 * 4/2004 Chen ..................... B82Y 40/00
423/447.2
7,641,829 B2 * 1/2010 Liang .................... C01B 32/176
264/913

(Continued)

*Primary Examiner* — Jennifer A Steele
(74) *Attorney, Agent, or Firm* — Kenja IP Law PC

(57) ABSTRACT

The present disclosure provides scalable nanotube fabrics and methods for controlling or otherwise adjusting the nanotube length distribution of a nanotube application solution in order to realize scalable nanotube fabrics. In one aspect of the present disclosure, one or more filtering operations are used to remove relatively long nanotube elements from a nanotube solution until nanotube length distribution of the nanotube solution conforms to a preselected or desired nanotube length distribution profile. In another aspect of the present disclosure, a sono-chemical cutting process is used to break up relatively long nanotube elements within a nanotube application solution into relatively short nanotube elements to realize a pre-selected or desired nanotube length distribution profile.

8 Claims, 19 Drawing Sheets

(51) Int. Cl.
- *D21H 13/50* (2006.01)
- *D21H 21/52* (2006.01)
- *D21H 15/02* (2006.01)
- *H01H 1/00* (2006.01)
- *G11C 13/02* (2006.01)
- *H01L 23/532* (2006.01)

(52) U.S. Cl.
CPC ............... *H01L 2924/0002* (2013.01); *Y10T 428/249921* (2015.04)

(56) References Cited

U.S. PATENT DOCUMENTS

| | | | |
|---|---|---|---|
| 2002/0085968 A1* | 7/2002 | Smalley | D01F 9/12 422/600 |
| 2003/0168385 A1* | 9/2003 | Papadimitrakopoulos | C01B 32/172 209/1 |
| 2006/0204427 A1* | 9/2006 | Ghenciu | D06M 11/50 423/445 B |
| 2008/0020248 A1* | 1/2008 | Sridhar | H01M 8/04201 429/444 |
| 2013/0052449 A1* | 2/2013 | Sen | C01B 32/159 428/221 |
| 2015/0111025 A1* | 4/2015 | Nishino | B82Y 40/00 428/323 |
| 2015/0228371 A1* | 8/2015 | Kim | H05K 1/0274 264/105 |

* cited by examiner 5 um

SCALABLE NANOTUBE FABRICS AND METHODS FOR MAKING SAME

TECHNICAL FIELD

The present disclosure relates to nanotube application solutions and fabric and films formed with nanotube application solutions. More particularly, the present disclosure relates scalable nanotube fabrics and methods for adjusting or otherwise controlling the nanotube length distribution of nanotube application solutions to form scalable nanotube fabrics.

CROSS-REFERENCE TO RELATED APPLICATIONS

This application is a continuation of U.S. patent application Ser. No. 14/033,158, entitled "Scalable Nanotube Fabrics and Methods for Making Same," filed Sep. 20, 2013. Further, this application relates to the following U.S. patents, which are assigned to the assignee of this application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Methods of Making Carbon Nanotube Films, Layers, Fabrics, Ribbons, Elements, and Articles (U.S. Pat. No. 7,566,478), filed Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Spin-Coatable Liquid for Formation of High Purity Nanotube Films (U.S. Pat. No. 7,375,369), filed Jun. 3, 2004;

High Purity Nanotube Fabrics and Films (U.S. Pat. No. 7,858,185), filed Jun. 3, 2004;

Resistive Elements Using Carbon Nanotubes (U.S. Pat. No. 7,365,632), filed Sep. 20, 2005;

Two-Terminal Nanotube Devices and Systems and Methods of Making Same (U.S. Pat. No. 7,781,862), filed Nov. 15, 2005;

Aqueous Carbon Nanotube Applicator Liquids and Methods for Producing Applicator Liquids Thereof (U.S. Pat. No. 7,666,382), filed Dec. 15, 2005;

Nonvolatile Nanotube Diodes and Nonvolatile Nanotube Blocks and Systems Using Same and Methods Of Making Same (U.S. Pat. No. 8,217,490), filed Aug. 8, 2007; and Carbon Nanotubes for the Selective Transfer of Heat from Electronics (U.S. Pat. No. 7,927,992), filed Mar. 6, 2008.

This application relates to the following patent applications, which are assigned to the assignee of this application, and are hereby incorporated by reference in their entirety:

Anisotropic Nanotube Fabric Layers and Films and Methods of Forming Same (U.S. patent application Ser. No. 12/533,704), filed Jul. 31, 2009;

Nanotube Solution Treated with Molecular Additive, Nanotube Film Having Enhanced Adhesion Property, and Methods for Forming the Nanotube Solution and the Nanotube Film (U.S. patent Ser. No. 13/416,820), filed Mar. 9, 2012;

Methods for Controlling Density, Porosity, and/or Gap Size within Nanotube Fabric Layers and Films (U.S. patent application Ser. No. 13/578,691), filed Aug. 13, 2012; and Nanotube Solutions with High Concentration and Low Contamination and Methods for Purifying Nanotube Solutions (U.S. patent application Ser. No. 13/825,070), filed Mar. 19, 2013.

BACKGROUND OF THE INVENTION

Any discussion of the related art throughout this specification should in no way be considered as an admission that such art is widely known or forms part of the common general knowledge in the field.

Nanotube fabric layers and films are used in a plurality of electronic structures, and devices. For example, U.S. Pat. No. 8,217,490 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. Pat. No. 7,927,992 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. Pat. No. 7,781,862 to Bertin et al., incorporated herein by reference in its entirety, allowing for such nanotube fabric layers and films to be used as memory or logic elements within an electronic system.

U.S. Pat. No. 7,335,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotubes are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. Pat. No. 7,666,382 to Ghenciu et al., incorporated herein by reference in its entirety, teach nanotube solutions well suited for forming a nanotube fabric layer over a substrate element via a spin coating process.

As the state of the art drives devices and structures that employ nanotube films and fabrics scale to smaller dimensions, there is a growing need for methods of adjusting or otherwise controlling the average length of nanotube elements—as well as the length distribution of nanotube elements—within nanotube fabrics and films. In this way, nanotube fabrics and films can be realized that are, in certain applications, more advantageous to scaling.

SUMMARY OF THE INVENTION

The present disclosure relates to scalable nanotube fabrics and methods for adjusting or otherwise controlling the nanotube length distribution within a nanotube application solution in order to provide scalable nanotube fabrics.

In particular, the present disclosure provides a scalable nanotube device. The scalable nanotube device comprises a first material layer conforming to a preselected feature size and a nanotube fabric layer having a nanotube distribution profile and comprising a plurality of nanotube elements in electrical communication with the first material layer. Within this scalable nanotube device, the nanotube length distribution profile of the nanotube fabric conforms to the preselected feature size.

According to one aspect of the present disclosure, a scalable nanotube device comprises a nanotube fabric wherein the mean or median length of the nanotube elements within the nanotube fabric layer is less than or equal to a preselected feature size.

According to another aspect of the present disclosure a scalable nanotube device comprises a nanotube fabric wherein the mean or median length of the nanotube elements within the nanotube fabric layer is a preselected fraction of said preselected feature size.

The present disclosure also provides a method for forming a scalable nanotube fabric. This method comprises first contacting a plurality of nanotubes with a liquid medium to obtain a nanotube solution. The method further comprises performing at least one nanotube length distribution adjustment process on the nanotube solution. The method further comprises depositing the nanotube solution over a material layer to form a nanotube fabric layer.

According to one aspect of the present disclosure, a nanotube length distribution adjustment process is a filtering process.

According to another aspect of the present disclosure, a nanotube length distribution adjustment process is a sono-chemical cutting process.

According to another aspect of the present disclosure a nanotube length distribution adjustment process reduces the mean length of nanotube elements within a fabric layer below a preselected range or "profile".

The present disclosure also provides a nanotube fabric article. This nanotube fabric article comprises a non-woven aggregate of nanotube elements having a nanotube distribution profile. The individual nanotube elements within the non-woven aggregate contact other nanotube elements to define a plurality of conductive pathways along the article. Further, the nanotube length distribution profile of the nanotube fabric article conforms to a preselected design parameter.

The present disclosure also provides a nanotube application solution. This nanotube application solution comprises a plurality of nanotubes suspended within a liquid medium wherein the nanotube length distribution profile of the nanotube application solution conforms to a preselected design parameter.

Other features and advantages of the present invention will become apparent from the following description of the invention, which is provided below in relation to the accompanying drawings.

DETAILED DESCRIPTION

Figure 1A:
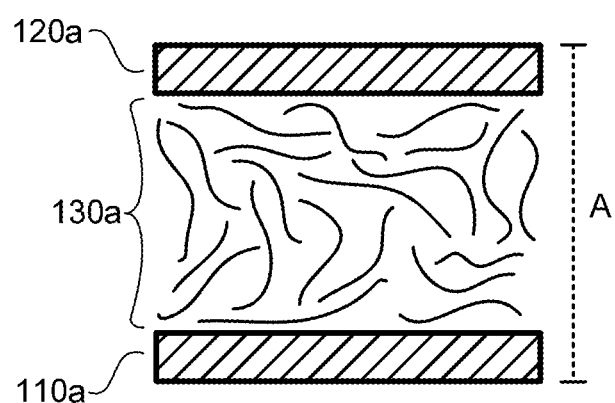
FIGS. 1A-1C are illustrations of two-terminal nanotube switching elements, at decreasing technology scales (A, A', and A", respectively), using nanotube fabrics comprising relatively long nanotube elements.

The present disclosure teaches methods for providing suspensions of nanotube elements wherein the length distribution of the nanotube elements within the solution is controlled or adjusted to within a preselected range or "profile." These solutions can then be, in turn, used to form nanotube fabrics comprising nanotube length distribution— that is, mean nanotube lengths and/or ranges of nanotube lengths—that conform to a required nanotube length distribution profile such as, for example, is required for a specific device geometry or function. Within the present disclosure, a nanotube length distribution profile refers to the mean length of nanotube elements within a solution or fabric as well as the range of nanotube lengths and the uniformity (e.g., standard deviation) of the nanotube elements within a solution or fabric (see, for example, FIGS. 5A, 7A, 8A, and 9A). It should be noted that while many of the examples within the present disclosure are described in terms of reducing nanotube length within a nanotube application solution or a nanotube fabric, the methods of the present disclosure can be used to shape or adjust any aspect of nanotube length distribution as is required for a specific application.

In one aspect of the present disclosure, a suspension of nanotube elements is passed through one or more filters such as to selectively remove relatively long nanotube elements from the solution and leave behind only the desired relatively short nanotube elements. As will be discussed in detail below, within this aspect of the present disclosure a nanotube application solution can be filtered once or a plurality of times, dependent on the needs of a specific application. Also, within this aspect of the present disclosure, one type of filter can be used or multiple types of filters (with, for example, varying pore sizes) can be used, again dependent on the needs of a specific application. In another aspect of the present disclosure, a suspension of nanotube elements is treated with a sono-chemical cutting process (introducing a chemical element into the solution and then sonicating the solution for a time period) to break up long nanotube elements into smaller elements. According to the present disclosure, these aspects (filtering and sono-chemical cutting) can be used alone or in concert, as befits the needs of a specific application. Within some applications, these steps can be repeated multiple times in an essentially continuous process to maximize the yield of nanotube elements within the desired distribution. Further, in certain aspects of the present disclosure, nanotube solution purification and defect reduction steps (such as, but not limited to, centrifugation, other types of filtration, and chemical treatments) can be combined (before, after, or during) the nanotube length distribution adjustment methods of the present disclosure. The present disclosure also describes nanotube fabrics comprised of nanotube elements that conform to a desired or preselected nanotube length distribution profile, as will be described in more detail below.

It should also be noted that the methods of the present disclosure provide a stable, highly pure nanotube application solution that is substantially free of surfactants, polymers, and other impurities (trace metals, for example). That is, the adjustment methods of the present disclosure provide a means for tailoring the nanotube length distribution of a nanotube application solution without negatively impacting the purity or stability of the solution. In this way, electronics grade nanotube application solutions can be adjusted and tailored such as to provide high quality nanotube fabrics well suited for specific scaling applications.

It should be noted that for many applications within the state of the art it has been undesirable to have nanotube fabrics and solutions comprising nanotube length distribution profiles featuring relatively short nanotube elements. For example, sensor elements using nanotube fabrics, conductive traces using patterned nanotube fabrics, or devices wherein nanotube elements are suspended in other materials as structural support elements (polymer switching elements, for example) all typically benefit from nanotube distributions featuring relatively long nanotubes. Indeed, much work within the state of the art has been to form stable suspensions and fabrics comprising relatively long nanotube elements. To this end, the methods of the present disclosure (adjusting the nanotube length distribution of a nanotube solution or fabric to feature relatively short nanotube elements) are directed at developing stable, highly pure nanotube solutions which address the relatively new needs of device scaling within the state of the art.

As formed, carbon nanotube (CNT) raw materials normally are isolated in a solid non-solubilized form. They do not readily form stable, non-precipitating suspensions in typical solvating media, such as water, alcohols, esters, and ethers. In order to integrate the manufacturing of nanotube devices with existing semiconductor facilities, it is often necessary to prepare a spin- or spray-coatable nanotube solution or dispersion before use. For example, a nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent, such as, but not limited to, ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma-butyrolactone, benzyl benzoate, salicylaldehyde, tetramethyl ammonium hydroxide, and esters of alpha-hydroxy carboxylic acids. In other embodiments, the liquid medium may contain or be predominantly a non-halogenated solvent. It should be noted that while examples used in this specification are directed to manufacturing of nanotube devices in existing semiconductor facilities, nanotube solutions may be used to form nanotube fabrics in other manufacturing facilities on ceramic surfaces, glass surfaces, polymer surfaces, and still other surfaces, and that these surfaces may be rigid or flexible. Furthermore, such nanotube solutions may be optimized for use on these alternate surfaces using methods described in this specification.

In this disclosure, the terms "nanotube solution," "nanotube application solution," "nanotube suspension," and "nanotube dispersion" may be used interchangeably to refer to the same thing. The nanotube solution may be an aqueous or non-aqueous solution, and the solvent may be water or an organic/inorganic liquid. In one embodiment, the nanotube solution is an aqueous solution and the solvent is water.

To fabricate memory and/or logic devices, analog devices, and components such as storage devices, sensors, resistors, capacitors, diodes, and transistors in an industrial scale, highly purified nanotube solutions are required—that is, nanotube application solutions that are substantially free from surfactants, trace metals, and/or other additives or impurities. In some cases, substantially free may refer to a concentration of less than or equal to 1 part-per-billion (ppb). Accordingly, extensive purification processes may be performed to the nanotube solution. In some embodiments, the purification processes may include one or more of a cross-flow filtration (CFF) process, a vacuum filtration process, sonication, centrifugation, treatments of certain chemicals, and/or any combinations thereof. Exemplary methods for purifying nanotube solutions have been disclosed in U.S. application Ser. No. 13/825,070, entitled "Carbon Nanotube Solutions with Low Contamination and Methods for Purifying Carbon Nanotube Solutions," filed Mar. 19, 2013, the entire contents of which are incorporated herein by reference.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity may be found on a larger scale, with regions of ordered nanotubes, in some cases, extended over substantially the entire fabric layer. Within the present disclosure, the terms "nanotube fabric" and "nanotube film" are used interchangeably to describe a fabric of nanotube elements as described here.

The fabrics of nanotubes retain desirable physical properties of the nanotubes from which they are formed. For example, in some electrical applications, the fabric preferably has a sufficient amount of nanotubes in contact so that at least one ohmic (metallic) or semiconductive pathway exists from a given point within the fabric to another point within the fabric. Single walled nanotubes may typically have a diameter of about 1-3 nm, and multi walled nanotubes may typically have a diameter of about 3-30 nm. The nanotubes may curve and occasionally cross one another. Gaps in the fabric, i.e., between nanotubes either laterally or vertically, may exist. Such fabrics may include single-walled nanotubes, multi-walled nanotubes, or both.

Within the present disclosure, relatively long nanotubes (untreated by the methods of the present disclosure) may have a lengths ranging from about 0.2 microns to about 200 microns, for example, depending on the specific application. Under one aspect of the present disclosure a relatively short nanotube can be on the order of about 1 micron. Under another aspect of the present disclosure relatively short nanotube can be on the order of about 500 nanometers. Under another aspect of the present disclosure a relatively short nanotube can be on the order of about 100 nanometers. Under another aspect of the present disclosure a relatively short nanotube can be on the order of about 50 nanometers. Under another aspect of the present disclosure a relatively short nanotube can be on the order of about 20 nanometers. Under another aspect of the present disclosure a relatively short nanotube can be on the order of about 10 nanometers. Under another aspect of the present disclosure a relatively short nanotube can be on the order of about 5 nanometers.

Further, it should be noted that within certain applications numerical limits for "short" and "long" can depend on the original source material of nanotube elements and the geometric requirements of a certain application. In such a case, for example, a relatively short nanotube element can be defined as a nanotube element that is on the order of half the length of the average length of the nanotube elements in the original solution. In another non-limiting example, a relatively short nanotube element can be defined as a nanotube element that is on the order of a third of the average length of the nanotube elements in the original solution. In another non-limiting example, a relatively short nanotube element can be defined as a nanotube element that is on the order of a tenth of the average length of the nanotube elements in the original solution. It should also be noted that within the present disclosure nanotube length is defined as the distance, from end to end, along the side wall of a nanotube element.

Further, within certain applications the methods of the present disclosure can be used to adjust a nanotube length distribution (within a nanotube application solution) such that the mean or median length of the nanotube elements within a solution or fabric falls within a preselected or desired range. Within such applications, such a preselected range can include, but is not limited to, 1 µm to 5 µm, 0.5 µm to 1 µm, 0.1 µm, to 0.5 µm, 50 nm to 100 nm, 20 nm to 50 nm, 10 nm to 20 nm, or 5 nm to 10 nm.

A nanotube fabric may have small areas of discontinuity with no nanotubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity.

Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes.

For example, use of a spin coating process, commonly employed in the preparation of thin film materials for electronic applications, including nanotubes involves applying an excess of the solution containing the material to be deposited, generally in a solvent or liquid suspension vehicle to a spinning substrate, often a silicon wafer on a rotating platen. Rotation, typically at high speeds spreads the fluid by centrifugal acceleration. Spinning is continued while the liquid is spun off of the edge of the substrate leaving behind a thin uniform film of nanotubes, in our case. The vehicle or solvent is typically volatile and evaporates from the film during the process or in combination with a post deposition evaporative procedure such as, for example, baking on a hot plate.

As described within U.S. Pat. No. 7,375,369 to Sen et al. and U.S. Pat. No. 7,666,382 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element.

Further, U.S. Patent Application Publication No. US 2013 0052449 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers. Further, U.S. Patent Application Publication No. US 2011 0244121 to Roberts et al., incorporated herein by reference in its entirety, teaches methods for ordering a nanotube fabric through the use of an applied directional force. Within certain applications, this ordering technique can be used with the methods of the present disclosure to provide dense fabrics of relatively short nanotube elements.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes or the chemical attachment of other, typically, organic moieties to the CNT sidewall to affect improved dispersion in the liquid media), or they may be non-functionalized.

Nanotube elements may be functionalized for a plurality of reasons. For example, certain moieties may be formed on the sidewalls of nanotube elements to aid in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through 7C-7C bonding.

Figure 1B:
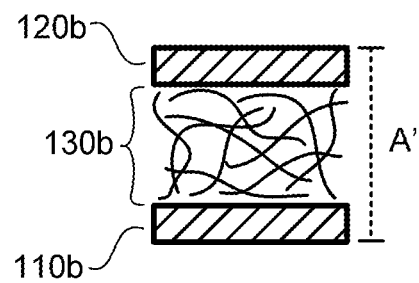
Figure 1C:
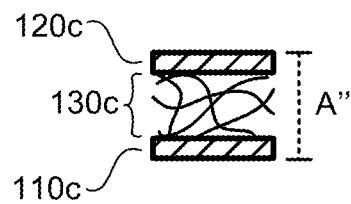

FIGS. 1A-1C depict illustrations of exemplary two-terminal nanotube switching devices (101, 102, and 103, respectively) in decreasing technology scales (A, A', and A", respectively). It should be noted that the exemplary devices (101, 102, and 103) in FIGS. 1A-1C represent device scaling in three dimensions (device height as well as device width and device length). Within each device (101, 102, 103) a nanotube fabric layer (130*a*, 130*b*, 130*c*), comprising a plurality of individual nanotube elements, is formed over a first conductive element (110*a*, 110*b*, 110*c*). A second conductive element (120*a*, 120*b*, 120*c*) is formed over the nanotube fabric layer (130*a*, 130*b*, 130*c*) such that it does not directly contact the first conductive element (110*a*, 110*b*, 110*c*). The nanotube fabric layer (130*a*, 130*b*, 130*c*) provides a conductive path between the first (110*a*, 110*b*, 110*c*) and second (120*a*, 120*b*, 120*c*) conductive elements. Responsive to an electrical stimulus applied across the first (110*a*, 110*b*, 110*c*) and second (120*a*, 120*b*, 120*c*) conductive elements, the resistivity of the nanotube fabric layer (130*a*, 130*b*, 130*c*) can be adjusted (switched) between two or more non-volatile states. In this way, the nanotube switching device (101, 102, 103) can be employed, for example, as a memory element. Within such an example, a high resistive state (e.g., on the order of 1 MΩ) can be used to represent a first logic level and a low resistive state (e.g., on the order of 100 kΩ) can be used to represent a second logic level.

U.S. patent application Ser. No. 11/280,786 to Bertin et al., incorporated herein by reference in its entirety, teaches the fabrication and use of such nonvolatile two-terminal nanotube switch elements in detail. As Bertin teaches, by placing different voltages across the electrode elements, the resistive state of the nanotube fabric article can be switched between a plurality of nonvolatile states. That is, in some embodiments the nanotube fabric article can be repeatedly switched between a relatively high resistive state (resulting in, essentially, an open circuit between the two electrode elements) and a relatively low resistive state (resulting in, essentially, a short circuit between the two electrode elements).

For the purposes of illustration, the three nanotube switching devices (101, 102, 103) shown in FIGS. 1A-1C depict nanotube fabric layers (130*a*, 130*b*, 130*c*) which comprise relatively long nanotube elements. Further, the nanotube length distribution of the nanotube elements within the nanotube fabric layer (130*a*, 130*b*, 130*c*) remains constant even as the geometrical dimensions (both vertical and horizontal) of the switching devices (101, 102, and 103) are scaled down. As is depicted within FIGS. 1B and 1C, this scaling results in fewer nanotube elements between the first (110*a*, 110*b*, 110*c*) and second (120*a*, 120*b*, 120*c*) conductive terminals as the geometric dimensions are reduced. In certain applications, this reduction could result in no nanotube elements being present in a specific device. The scaling, as depicted in FIGS. 1A-1C, also results in a device wherein the average length of the nanotube elements is equal to or longer than the distance between the first (110*a*, 110*b*, 110*c*) and second (120*a*, 120*b*, 120*c*) conductive terminals. As such, some of the individual nanotube elements may be in contact with both the first (110*a*, 110*b*, 110*c*) and second (120*a*, 120*b*, 120*c*) terminals. Further, within certain applications where nanotube lengths are equal to or greater than the dimensions of a device in which they are used, nanotube pinning can occur. Within such applications, individual nanotube elements can be formed such that they are pinned (fixed in place) at both ends by other material layers. For example, a nanotube element orientated essentially horizontally in switching device 103 might be pinned at both ends by dielectric material deposited against the sidewalls of the device 103. Within certain applications, for example, nanotube pinning can adversely affect the switching function of the nanotube elements. Further, within certain applications, any number of these differences (the reduction of the number of individual nanotube elements within a device, having individual nanotube elements that span the length of the device, and nanotube pinning) may alter the electrical characteristics and behavior of the nanotube fabric element (130*a*, 130*b*, 130*c*) as it functions within a device. For such applications, then, it would be advantageous to provide a method for controlling or otherwise adjusting the nanotube length distribution of a nanotube application solution (and, ultimately, a nanotube fabric) as device geometry is reduced. In this way, for example, the mean nanotube length within a nanotube fabric could be reduced such as to fall within a preselected range or conform to a desired nanotube length distribution profile. In certain applications, such a nanotube length distribution adjustment can preserve functionality of a device even as the device is scaled.

Figure 2:
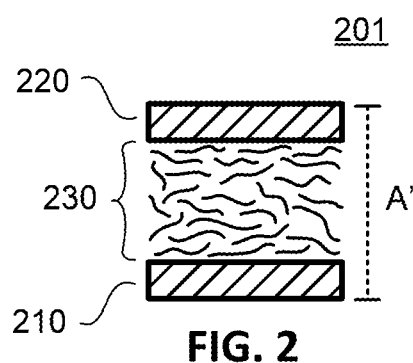
FIG. 2 is an illustration of a two-terminal nanotube switching element on the same technology scale as depicted in FIG. 1B (A') but wherein the nanotube fabric comprises relatively short nanotube elements.
Figure 3:
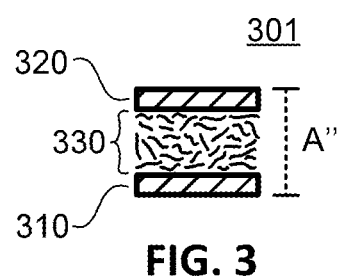
FIG. 3 is an illustration of a two-terminal nanotube switching element on the same technology scale as depicted in FIG. 1C (A") but wherein the nanotube fabric comprises very short nanotube elements.

To this end, FIGS. 2 and 3 depict two-terminal nanotube switching elements (201 and 301, respectively) with nanotube fabric elements (230 and 330, respectively) comprising relatively short nanotube elements. The corresponding reduction in nanotube length as the two-terminal nanotube switching element is scaled to the A' dimension (within FIG. 2) and the A" dimension (within FIG. 3) keeps the number of individual elements between the first (210 and 310) and second contacts (220 and 320) essentially consistent. Within certain applications, the use of relatively short nanotube elements also limits the number of individual nanotube elements that span the entire length of the device (horizontally or vertically).

As illustrated in FIGS. 2 and 3, the methods of the present disclosure provide scalable nanotube fabrics and methods for making the same. Within the present disclosure the term "scalable" is used in reference to nanotube fabrics to describe a nanotube fabric in which the length of the individual nanotube elements within the fabric (the nanotube length distribution) is reduced in size as the dimensions of the nanotube fabric (or feature size of the device in which the nanotube fabric is used) are reduced. That is, a scalable nanotube fabric is a nanotube fabric in which the nanotube length distribution is tailored to conform with a preselected or required feature size (e.g., A, A', or A" in FIGS. 1A-1C, 2, and 3). Within scalable nanotube fabrics the nanotube length distribution is adjusted to preserve functionality of the nanotube fabric at a required feature size or dimension.

To this end, the present disclosure provides scalable nanotube fabrics as well as scalable nanotube devices that include such fabrics (such as, but not limited to, two-terminal nanotube switches, nanotube field effect transistors, and nanotube sensors) with nanotube length distribution profiles that conform to a preselected feature size or design parameter. The present disclosure also provide methods for making scalable nanotube fabrics and scalable nanotube devices, as will be discussed in more detail below. Within certain applications, a scalable nanotube fabric comprises a nanotube fabric wherein the mean or median length of the nanotube elements within the fabric is less than or equal to a preselected feature size (e.g., a minimum feature size). Within other applications, a scalable nanotube fabric comprises a nanotube fabric wherein the mean or median length of the nanotube elements within the fabric is some preselected fraction of a preselected feature size (for example, but not limited to, ⅞, ¾, ½, or ¼).

Figure 4:
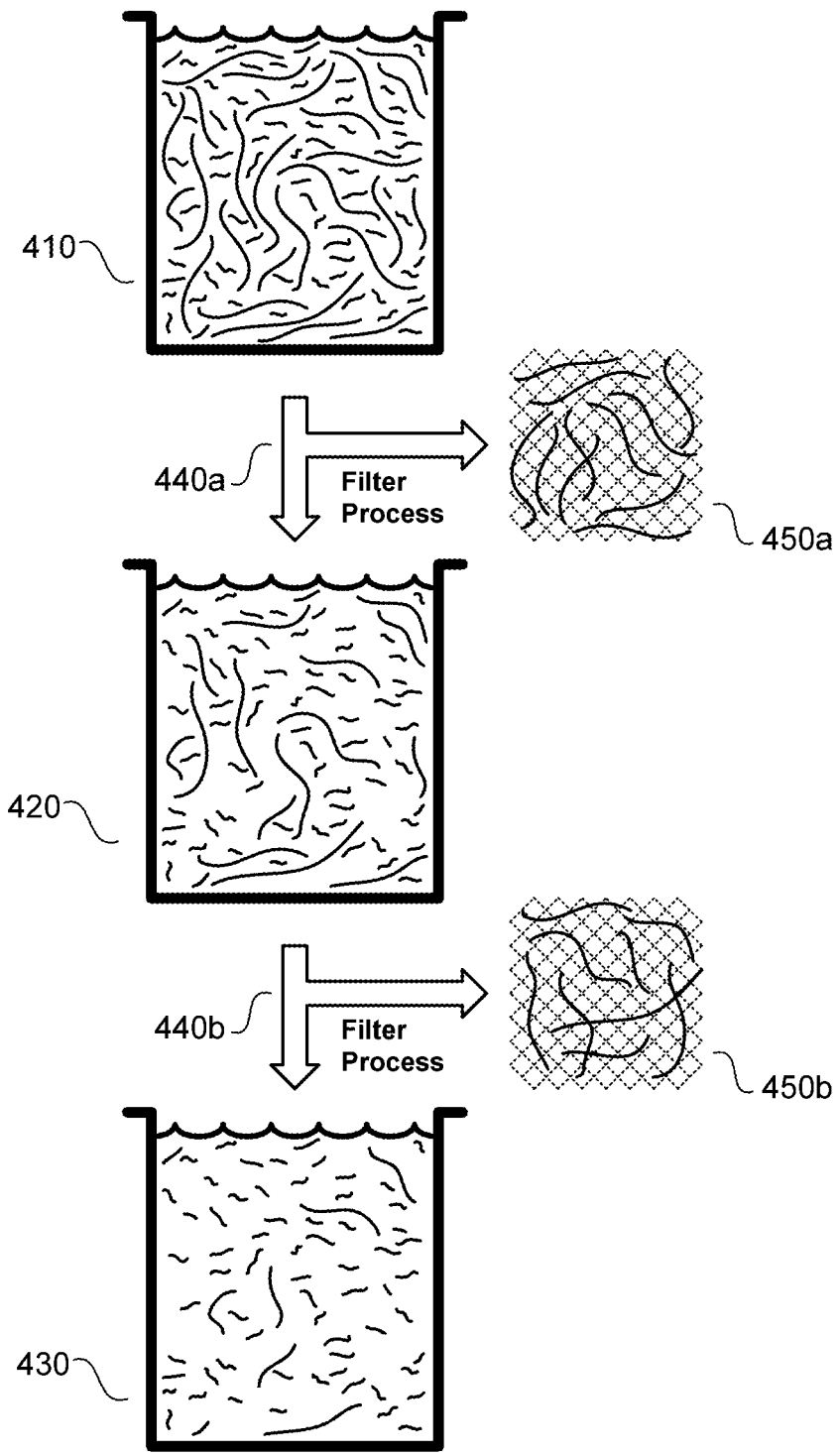
FIG. 4 is a process diagram depicting a method according to the present disclosure of filtering a nanotube application solution to realize a solution comprising relatively short nanotube elements.

FIG. 4 is a process diagram 401 illustrating a first method for adjusting the nanotube length distribution of a nanotube application solution. This first method uses one or more filtering processes to remove relatively long nanotubes from a nanotube application solution, thereby significantly reducing the number of relatively long nanotube elements within the solution. In this way, the average length of the nanotube elements in the solution can be reduced below a predetermined threshold, as befits the needs of a specific application. This method can also be used, in certain applications, to provide a nanotube solution wherein the nanotube elements conform to a substantially uniform length. This method can also be used, in certain applications, to tighten and/or shift the length distribution of nanotube elements within an application solution to a within a preselected range.

Looking now to FIG. 4, a nanotube application solution is provided in an initial state 410 and comprises a mixture of relatively long and relatively short nanotubes. The initial solution 410 is then passed through a first filter process 440*a* wherein a plurality of the relatively long nanotube elements 450*a* are removed from the solution, resulting in intermediate nanotube application solution 420, which comprises significantly fewer relatively long nanotube elements. The intermediate solution 420 is then passed through a second filter process 440*b* wherein a second plurality of relatively long nanotube elements 450*b* are removed from the solution, resulting in final solution 430, which comprises mostly short nanotube elements. In this way, the average length of the nanotube elements within the nanotube application solution can be reduced to or below a predetermined threshold and/or the nanotube length distribution (e.g., standard deviation) can be adjusted or shifted to within a preselected range.

It should be noted that while the process 401 depicted in FIG. 4 shows two filter process steps (440*a* and 440*b*), the methods of the present disclosure are not limited in this regard. Indeed, any number of filter process steps may be used until a desired nanotube average length is realized. Further, different types of filtering or separation processes (such as, but not limited to, a surface filter, a depth filter, cross flow filtration, and a centrifugation process) can be used at different stages in the process as best befits the needs of a specific application. For example, filters with successively decreasing pore sizes can be used. Or, in another example, a depth filter can be used in the initial processing steps to remove longer nanotubes, and then a surface filter can be used in subsequent steps to remove medium sized nanotubes.

Figure 5A:
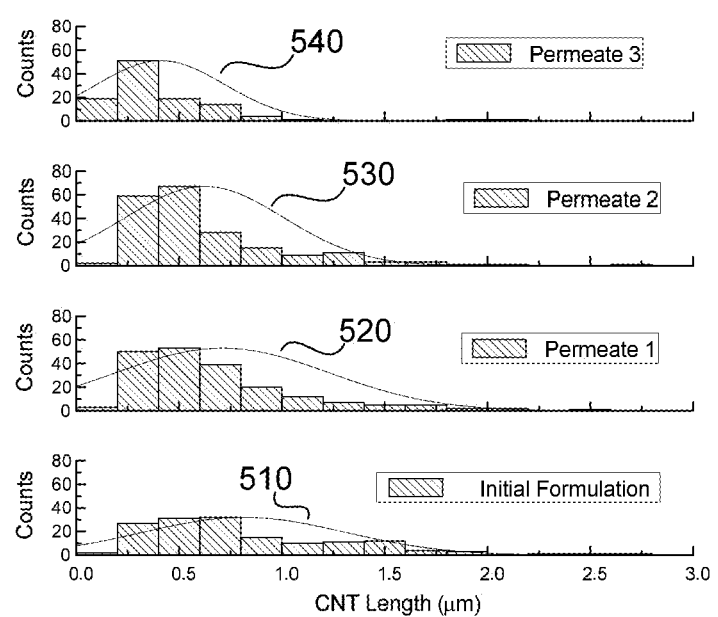
FIG. 5A is a series of plots showing the adjustment of the nanotube length distribution within a first exemplary nanotube application solution after successive filtering processes according to the methods of the present disclosure.

FIG. 5A is a series of plots 501 detailing the iterative results of a first exemplary nanotube length distribution adjustment process according to the methods of the present disclosure. Specifically, the plots 501 of FIG. 5A detail a one liter suspension of nanotube elements as it was processed through a cross flow filtration (CFF) system using a 6 μm membrane three times in succession. A nanotube fabric was formed (via a spin coating operation) from a sample of the solution prior to the start of the nanotube length distribution adjustment process and then again after each successive filtering step. These nanotube fabric samples were then analyzed to provide the plots of nanotube length distribution profiles within the solution at each step within the process.

The bottom most curve in FIG. 5A (510) shows the nanotube length distribution of the initial nanotube formulation. Within this initial nanotube formulation, the mean nanotube length is 0.82 μm with a standard deviation of 0.49 μm. After the first CFF processing step, curve 520 shows that the mean nanotube length has been reduced to 0.71 μm with a standard deviation of 0.52 μm. After the second CFF processing step, curve 530 shows that the mean nanotube length has been reduced to 0.62 μm with a standard deviation of 0.39 μm. And after the final CFF processing step, curve 540 shows that the mean the nanotube length has been reduced to 0.41 μm with a standard deviation of 0.31 μm. Within the exemplary process detailed in FIG. 5A, the average nanotube length was reduced by a factor of 2 (that is, the mean length of the nanotube elements within the final solution was half of the average length of the nanotube elements in the initial solution) and the uniformity of nanotube elements (with respect to length) was increased significantly.

Figure 5B:
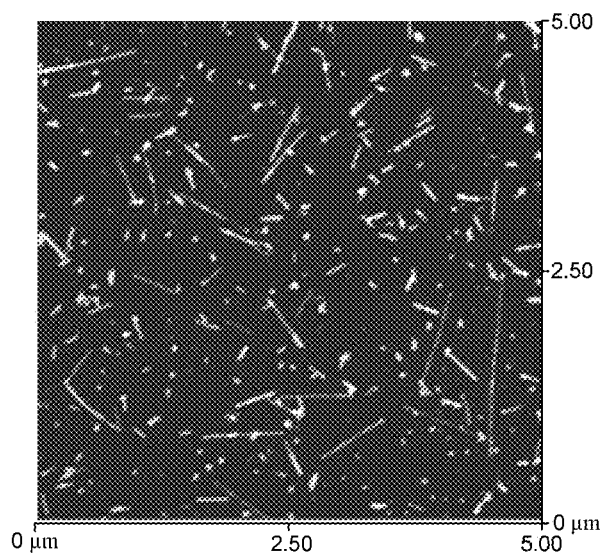
FIG. 5B is an AFM depicting a nanotube fabric formed with the first exemplary nanotube application solution described in relation to FIG. 5A after filtering.
Figure 5C:
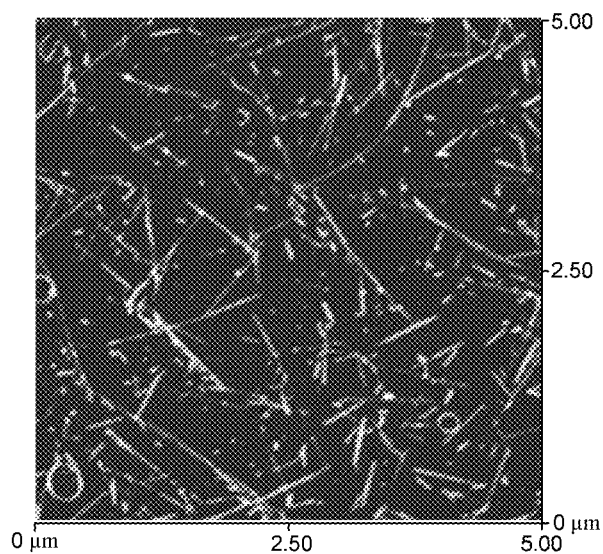
FIG. 5C is an AFM depicting a nanotube fabric formed with the first exemplary nanotube application solution described in relation to FIG. 5A before filtering.

FIG. 5B is an AFM image 502 showing a nanotube fabric formed with a sample of the final adjusted nanotube solution detailed in curve 540 of FIG. 5A. The mean length of nanotube elements in the fabric in AFM image 502 is 410 nm. For comparison FIG. 5C is an AFM image 503 of the initial nanotube formulation used to carry out the filtration work as detailed in curve 510 of FIG. 5A. The mean length of nanotube elements in the fabric in the AFM image 503 of FIG. 5C was measured to be 820 nm.

In certain application, successive filtering processes as described above can be used to minimize (or effectively remove) the "tails" from a nanotube length distribution profile. That is, the few relatively long nanotubes within the solution that tend to widen the distribution (as can be seen in curves 520 and 530 of FIG. 5A, for example). Using the filtering methods of the present disclosure (as described above), these longer tubes can separated from a nanotube application solution to realize a "tighter" (more uniform, in certain applications) distribution. In certain applications, multiple filtering process steps is useful in pulling in these tails. In certain applications, filtering using a centrifugation process (for example) can also aid in removing the relatively long tubes and tightening the nanotube length distribution.

Figure 6:
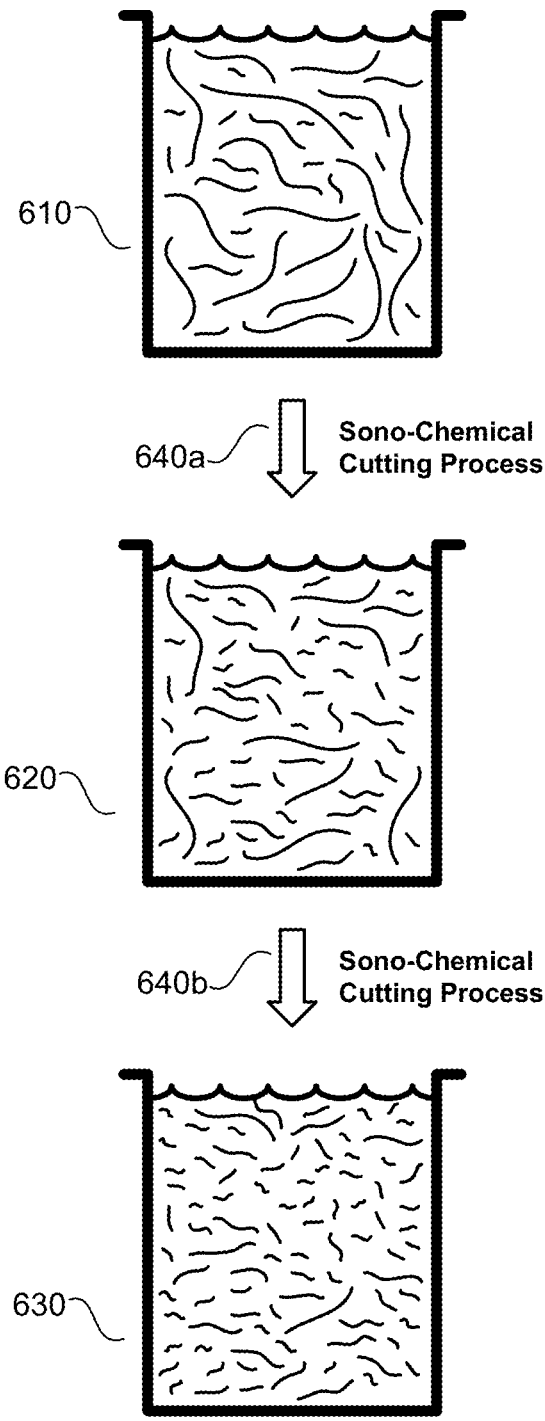
FIG. 6 is a process diagram depicting a method according to the present disclosure of using a sono-chemical cutting process on a nanotube application solution to realize a solution comprising relatively short nanotube elements.

FIG. 6 is a process diagram 601 illustrating a second method for providing a nanotube application solution wherein the average length of nanotube elements is relatively short. This second method uses one or more sono-chemical cutting processes to break up relatively long nanotubes within a nanotube application solution, rendering them into relatively short nanotube elements. A chemical agent—for example, but not limited to, a sulfuric acid/nitric acid mix—is introduced into the nanotube suspension, and then the suspension is sonicated for a length of time. Depending on the specific application, a purification process may be used after sonication to remove the chemical agent or any impurities introduced into the solution during the sono-chemical cutting process. Further, in certain applications the adjusted nanotube elements may be removed from the sonicated solution (or slurry), purified, and then reconstituted into a new nanotube application solution. Sonication frequencies used to carry out the cutting process include, but are not limited to, 40 kHz, 20 kHz, and 16 kHz and can be done using a single frequency mode or a dual frequency mode. Further, in certain applications the sono-chemical cutting process can also include bubbling a gas (for example, but not limited to, argon, xenon, ozone, $N_2$, $O_2$, $CO_2$, dry $H_2O_2$, or air) through the mixture to aid in the cutting process. Control of the hydrostatic pressure between the vapor pressure of the solvent and up to pressures greater than one atmosphere (>1 ATM) can also tailor the efficacy of the sonication cutting process for a specific preselected length distribution. Further still, in certain applications the temperature at which a nanotube application solution is sonicated can be controlled to add in the cutting process. For example, but not limited to, a solution may be kept at 15° C., 20° C., or 40° C. as befits the needs of specific application or specific sono-chemical cutting process. In this way, the average length of the nanotube elements within the nanotube application solution can be reduced to within a predetermined range and/or the nanotube length distribution profile can be adjusted or shifted to conform to a specific set of design parameters as befits the needs of a specific application.

Looking now to FIG. 6, a nanotube application solution is provided in an initial state 610 and is comprised of mostly relatively long nanotubes. The initial nanotube application solution 610 is then treated with a first sono-chemical cutting process 640a wherein a chemical agent (for example, but not limited to, a sulfuric-nitric mix) is introduced into the solution and the solution is then sonicated for a period of time. In this way, intermediate nanotube application solution 620 is realized, which comprises significantly fewer relatively long nanotube elements and an increased number of relatively short nanotube elements. The intermediate nanotube application solution 620 is then passed through a second sono-chemical cutting process 640b resulting in the final nanotube application solution 630, which comprises mostly short nanotube elements. In this way, the nanotube length distribution within a nanotube application solution can be adjusted such that, for example, the average length of the nanotube elements within the solution is reduced or shifted to within a desired or preselected range.

It should be noted that while the process 601 depicted in FIG. 6 shows two sono-chemical cutting process steps (640a and 640b), the methods of the present disclosure are not limited in this regard. Indeed, any number of sono-chemical cutting process steps can be used until a desired nanotube average length is realized. Further, the length of time each process step sonicates the solution can vary depending on the needs of a particular application. For example, a sono-chemical cutting process can use a sonication time on the order of 1 hour, 2 hours, 5 hours, 10 hours, 15 hours, or 24 hours. Further, the chemical agent used in each sono-chemical cutting process can vary as befits the needs of a particular application.

Figure 7A:
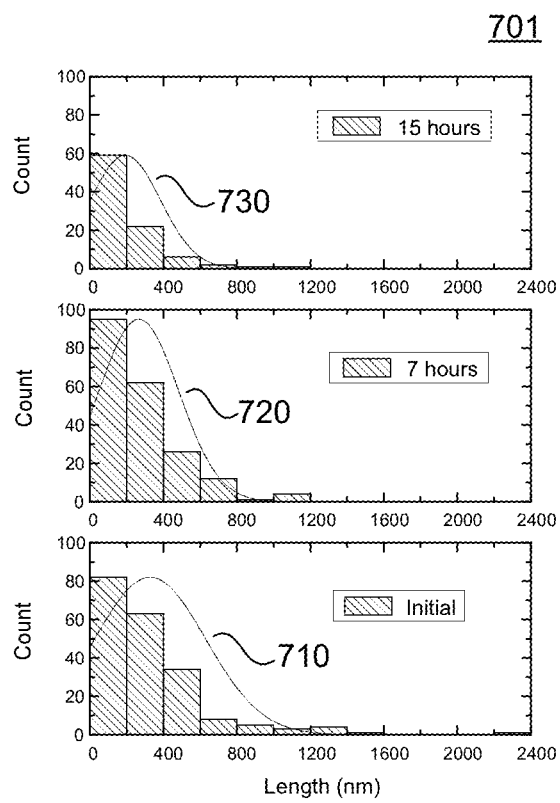
FIG. 7A is a series of plots showing the adjustment of the nanotube length distribution within a second exemplary nanotube application solution at certain points within a sono-chemical cutting process according to the methods of the present disclosure.

FIG. 7A is series of plots 701 detailing the results of a second exemplary nanotube length distribution adjustment process according to the methods of the present disclosure. Specifically, the plots of FIG. 7A detail a one liter suspension of nanotube elements as it was processed through two sono-chemical cutting processes. As a control, a first volume of the initial nanotube suspension was prepared by refluxing in a 35% nitric solution for 3 hours to remove impurities. A sample of the purified initial solution (which had not been subject to any sono-chemical cutting processes) was then used to form a nanotube fabric, and that fabric analyzed to provide curve 710 detailing the average nanotube length and nanotube length distribution profile within the purified initial solution. As shown in curve 710, the mean nanotube length in the purified initial solution was 328 nm with a standard deviation of 303 nm. The median length of the nanotubes shown in curve 710 was 260 nm. With respect to curve 720, a second volume of the initial nanotube suspension was sonicated in a sulfuric-nitric mix for seven hours (7 hrs) followed by a reflux in a 20% nitric solution for 1.5 hours (the refluxing step used to remove impurities in the solution). As with the control solution, a sample of the seven-hour sonicated solution was used to form a nanotube fabric layer, and that fabric layer analyzed to provide curve 720. As shown in curve 720, the mean nanotube length within the seven hour sonicated solution was reduced to 266 nm with a standard deviation of 217 nm. The median length of the nanotubes shown in curve 720 was reduced to 212 nm. With respect to curve 730, a third volume of the initial nanotube suspension was sonicated in a sulfuric-nitric mix, this time for fifteen hours (15 hrs) followed by a reflux in 20% nitric solution for 1.5 hours (again, the refluxing step used to remove impurities in the solution). A sample of the fifteen-hour sonicated solution was then used to form a nanotube fabric, and that fabric layer analyzed to provide curve 730. As can be seen in curve 730, the average nanotube length in the fifteen-hour sonicated solution was reduced to 193 nm with a standard deviation of 191 nm. The median of the fifteen-hour sonicated sample as shown in curve 730 was reduced to 121 nm. Within the exemplary process detailed in FIG. 7A, the average nanotube length was reduced by a factor of about 2 (that is, the mean length of the nanotube elements within the final solution was reduced to half of the average length of the nanotube elements in the initial solution).

Figure 7B:
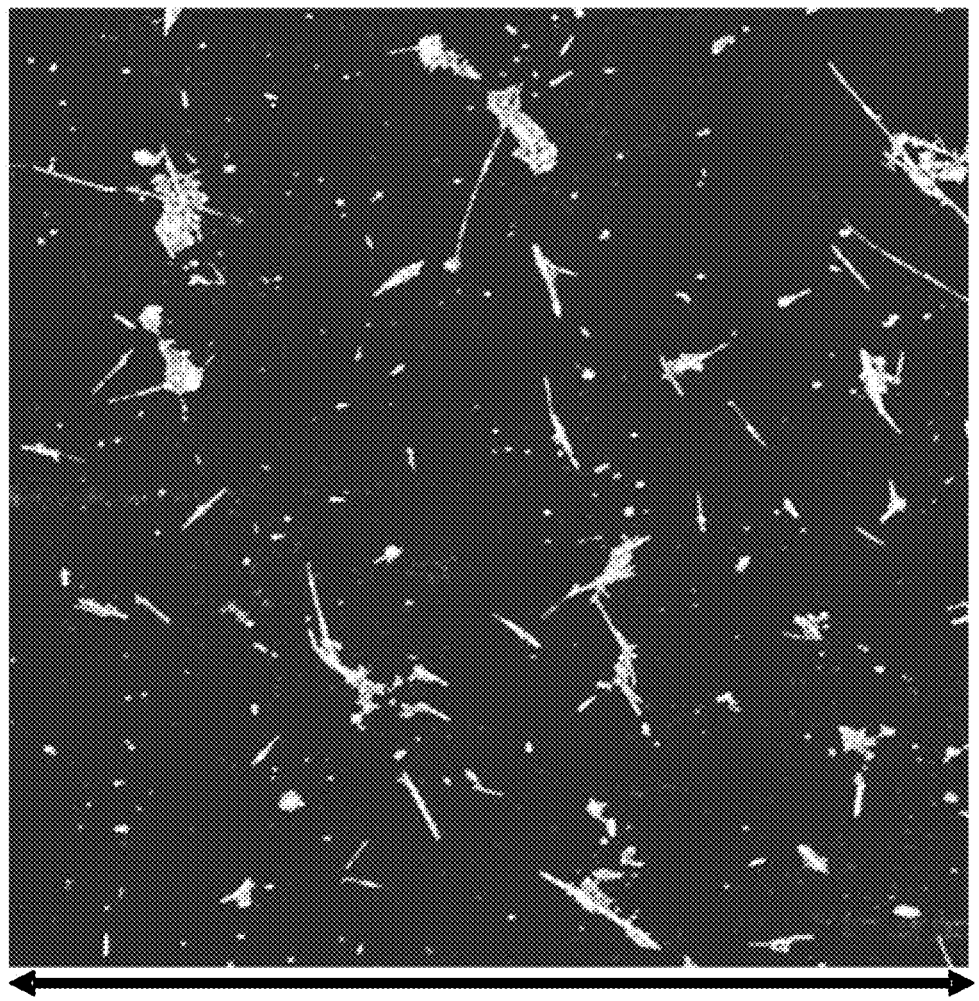
FIG. 7B is an AFM depicting a nanotube fabric formed with the second exemplary nanotube application solution described in relation to FIG. 7A after 15 hours of sono-chemical cutting treatment.
Figure 7C:
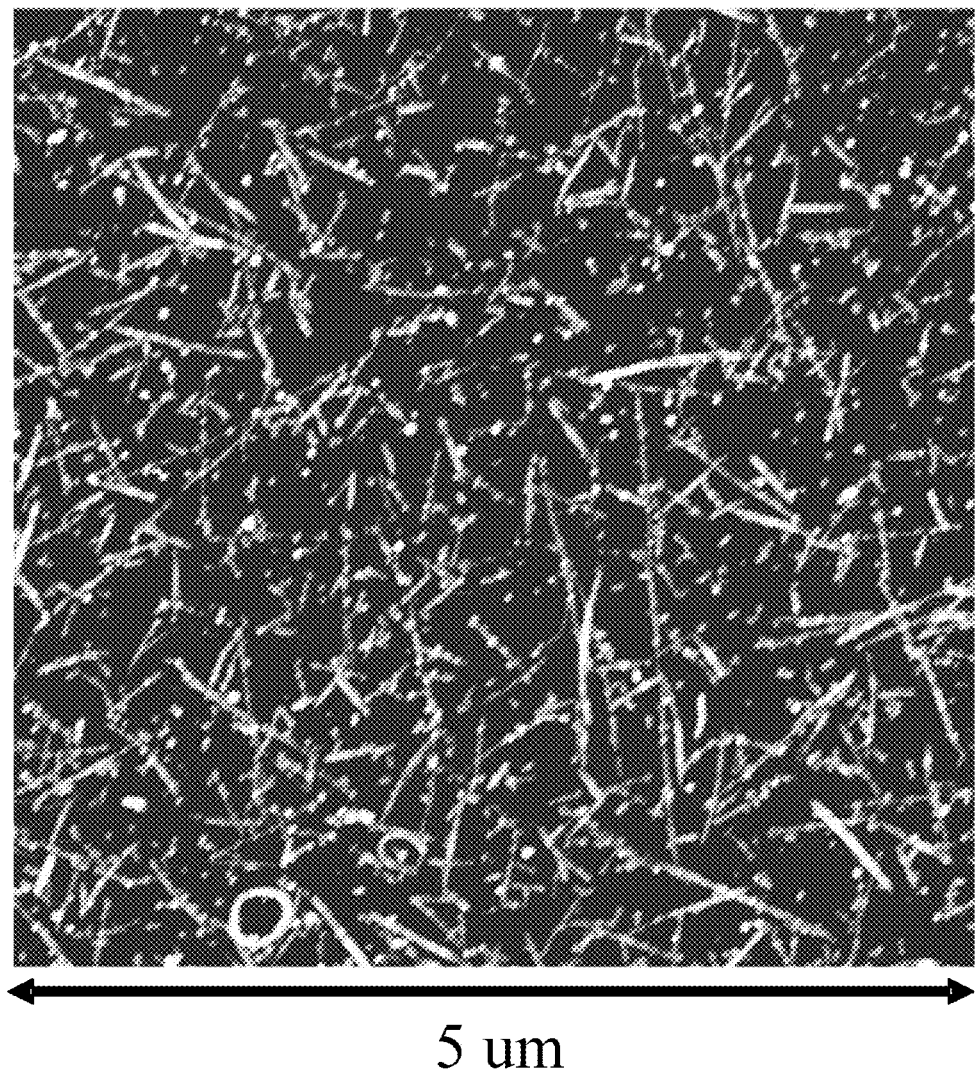
FIG. 7C is an AFM depicting a nanotube fabric formed with the second exemplary nanotube application solution described in relation to FIG. 7A prior to any sono-chemical cutting treatment.

FIG. 7B is an AFM image 702 showing a nanotube fabric formed with a sample of the final adjusted nanotube solution detailed in curve 730 of FIG. 7A. The mean length of nanotube elements in the fabric in AFM image 702 is 193 nm. FIG. 7C is an AFM image 703 showing a nanotube fabric formed from the initial solution detailed in curve 710 of FIG. 7A. As can be seen in the AFM image 703, there are significantly more relatively long nanotubes in the pre-adjusted nanotube fabric as compared with AFM image 702 of the post-adjusted nanotube fabric. The mean length of the nanotube elements in the nanotube fabric in AFM image 703 is 328 nm.

Figure 8A:
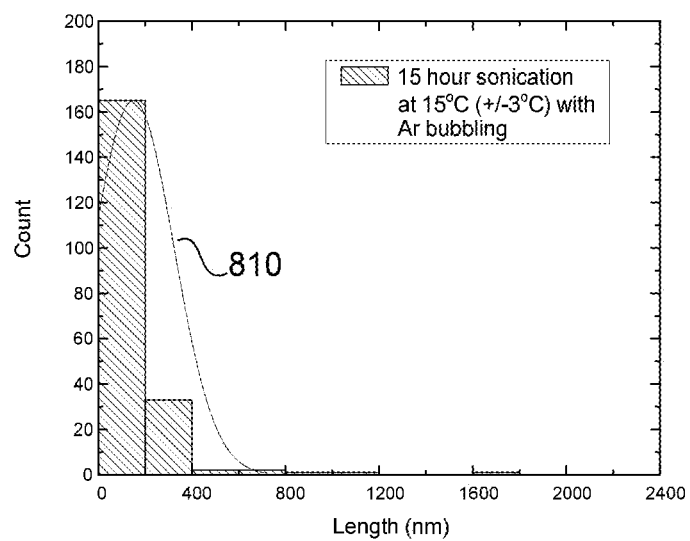
FIG. 8A is a plot showing the nanotube length distribution profile of a third exemplary nanotube application solution after a sono-chemical cutting process.

FIG. 8A is a plot 801 detailing the results of a third exemplary nanotube length distribution adjustment process according to the methods of the present disclosure. As with the plots 701 of FIG. 7A, the nanotube length distribution adjustment process detailed in FIG. 8A uses a sono-chemical cutting process using a sulfuric-nitric mix.

Referring to curve 810, an initial suspension of nanotube elements was sonicated in a sulfuric-nitric mix for fifteen hours (15 hrs) while bubbling with argon gas through the mixture. The temperature of the sonicator bath was maintained at 15° C. (+/−3° C.). The sonication process was then followed by a reflux in a 20% nitric solution for 1.5 hours (the refluxing step used to remove impurities in the solution). A sample of this fifteen-hour sonicated solution was used to form a nanotube fabric layer, and that fabric analyzed to provide curve 810. As shown in curve 810, the mean nanotube length within the fifteen hour sonicated solution was adjusted to 150 nm with a standard deviation of 174 nm and a median length of 104 nm.

Figure 8B:
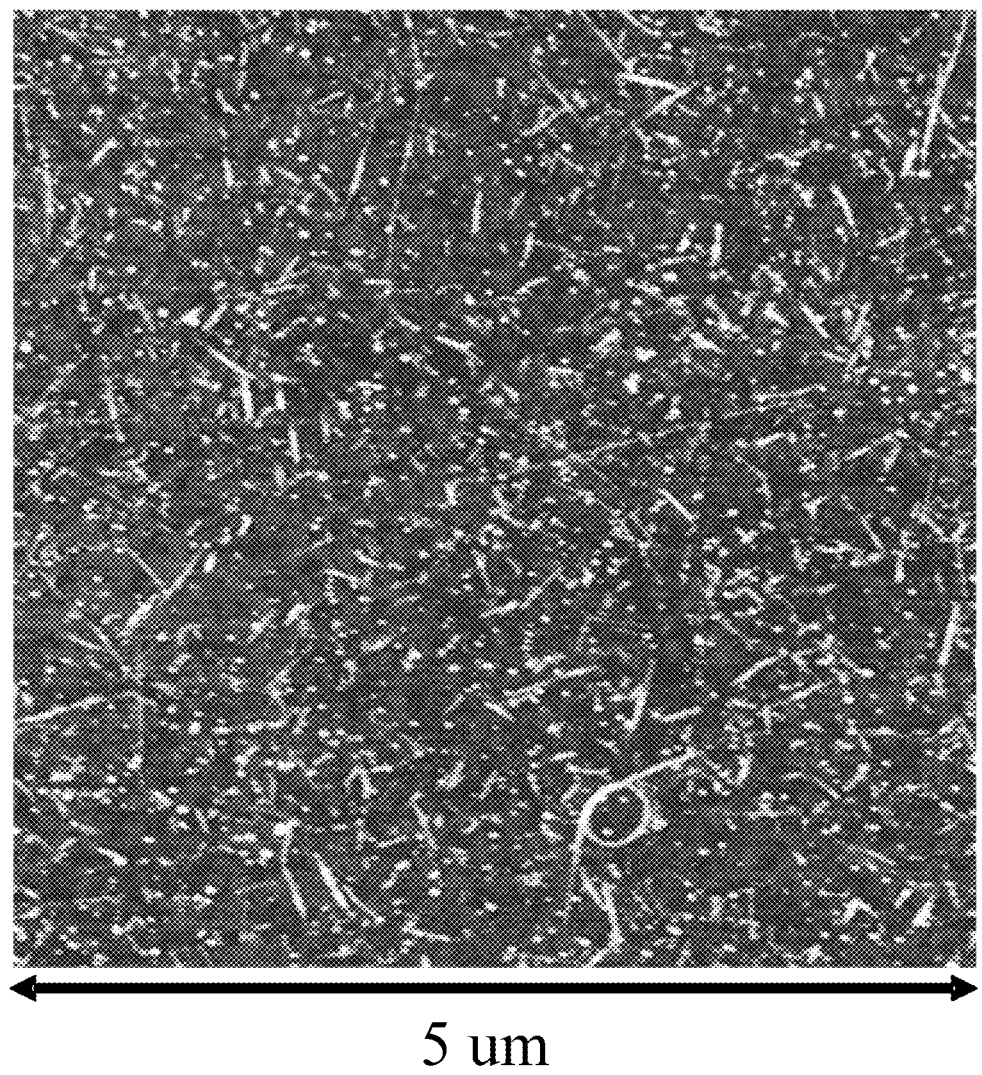
FIG. 8B is an AFM depicting a nanotube fabric formed with the third exemplary nanotube application solution described in relation to FIG. 8A (after 15 hours of treatment)

FIG. 8B is an AFM image 802 showing a nanotube fabric formed with a sample of the adjusted nanotube solution detailed in curve 810 of FIG. 8A. The mean length of nanotube elements in the fabric in AFM image 802 is 150 nm (with a median length of 104 nm).

Figure 9A:
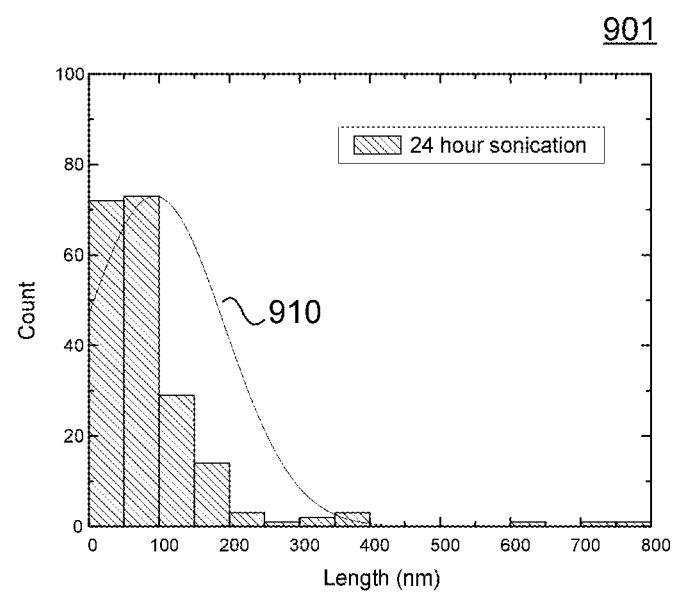
FIG. 9A is a plot showing the nanotube length distribution profile of a fourth exemplary nanotube application solution after a sono-chemical cutting process.

FIG. 9A is a plot 901 detailing the results of a fourth exemplary nanotube length distribution adjustment process according to the methods of the present disclosure. As with the plots of FIG. 7A and FIG. 8A (701 and 801, respectively), the nanotube length distribution adjustment process detailed in FIG. 9A uses a sono-chemical cutting process using a sulfuric-nitric mix.

Referring to curve 910, an initial suspension of nanotube elements was sonicated in a sulfuric-nitric mix for twenty-four hours (24 hrs). The sonication process was then followed by a reflux in a 20% nitric solution for 1.5 hours (the refluxing step used to remove impurities in the solution). A sample of this twenty-four hour sonicated solution was used to form a nanotube fabric layer, and that fabric analyzed to provide curve 910. As shown in curve 910, the mean nanotube length within the twenty-four hour sonicated solution was adjusted to 94 nm with a standard deviation of 99 nm and a median length of 70 nm. Within the exemplary process detailed in FIG. 9A, a mean nanotube length of the order of 90 nm and a median nanotube length on the order of 70 nm was realized with a single sono-chemical cutting process step. Further processing using one or a combination of methods of the present disclosure (described further above) can reduce the average and/or the median of the nanotube length distribution to less than 10 nm.

Figure 9B:
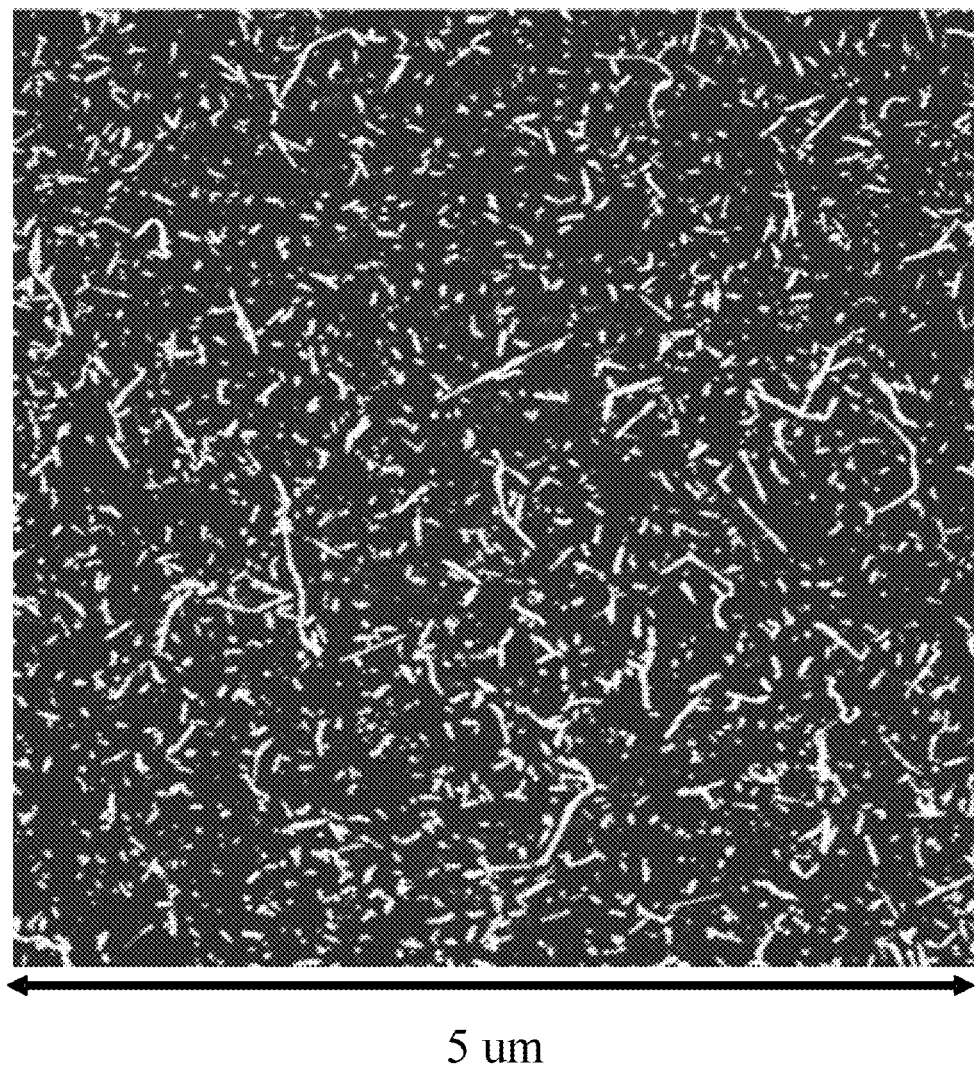
FIG. 9B is an AFM depicting a nanotube fabric formed with the fourth exemplary nanotube application solution described in relation to FIG. 9A (after 24 hours of treatment)

FIG. 9B is an AFM image 902 showing a nanotube fabric formed with a sample of the final adjusted nanotube solution detailed in curve 910 of FIG. 9A. The mean length of nanotube elements in the fabric in AFM image 902 is 94 nm.

Figure 10A:
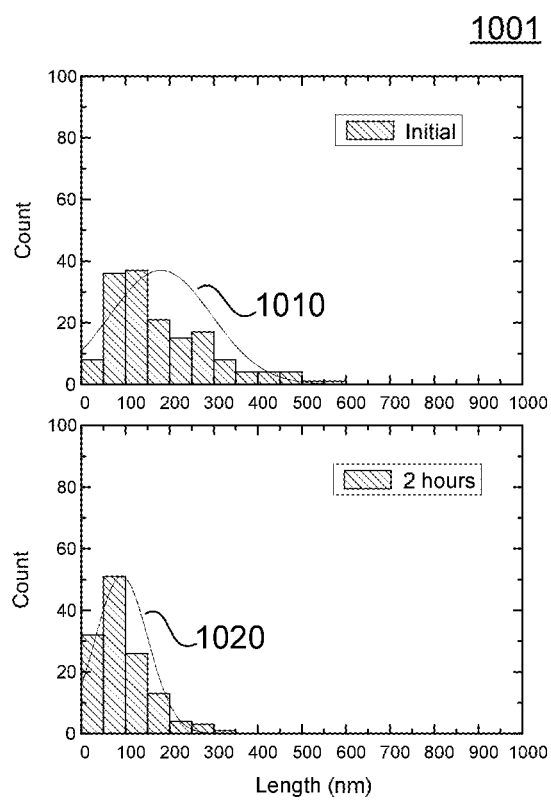
FIG. 10A is a plot showing the nanotube length distribution profile of a fifth exemplary nanotube application solution after a centrifugation process.

FIG. 10A is a plot 1001 detailing the results of a fifth exemplary nanotube length distribution adjustment process according to the methods of the present disclosure. The nanotube length distribution adjustment process detailed in FIG. 10A uses a centrifugation process to separate relatively long nanotube elements from the solution and tighten the nanotube length distribution.

Referring now to curve 1010, a first volume of an initial nanotube suspension was prepared by refluxing in a 40% nitric solution for 6 hours to remove impurities. As a control, a sample of the purified initial solution (which had not been subject to any centrifugation processes) was then used to form a nanotube fabric, and that fabric analyzed to provide curve 1010 detailing the average nanotube length and nanotube length distribution profile within the purified initial solution. As shown in curve 1010, the mean nanotube length in the purified initial solution was 180 nm with a median length of 143 nm and a standard deviation of 115 nm. It should also be noted that the max nanotube length shown in curve 1010 (the "tail" in the distribution) is 595 nm. With respect to curve 1020, a second volume of the initial nanotube suspension was processed through a centrifugation process for two hours (2 hrs). As with the control solution, a sample of the two-hour centrifuged solution was used to form a nanotube fabric layer, and that fabric layer analyzed to provide curve 1020. As shown in curve 1020, the mean nanotube length within the two-hour centrifuged solution was reduced to 91 nm with a median length of 76 nm standard deviation of 59 nm. It should also be noted that the maximum nanotube length shown in curve 1020 is 302 nm. That is, while the average length of the nanotube elements with the distribution was reduced by a factor of two, the "tail" of the entire distribution was also significantly tightened through the centrifugation process detailed in FIG. 10A.

Figure 10B:
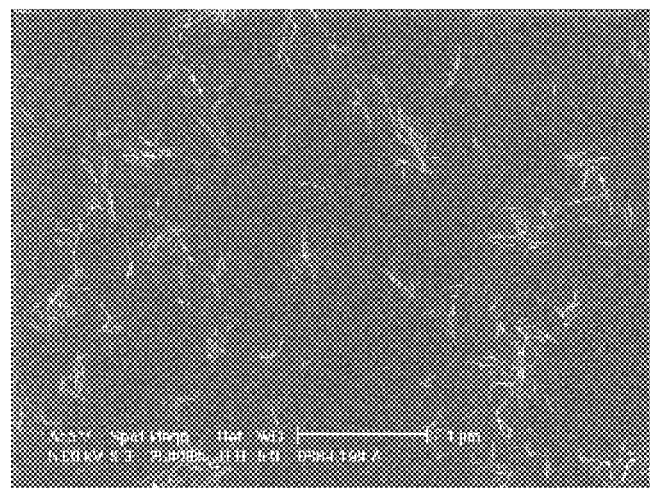
FIG. 10B is an SEM depicting a nanotube fabric formed with the fifth exemplary nanotube application solution described in relation to FIG. 10A before any centrifugation.
Figure 10C:
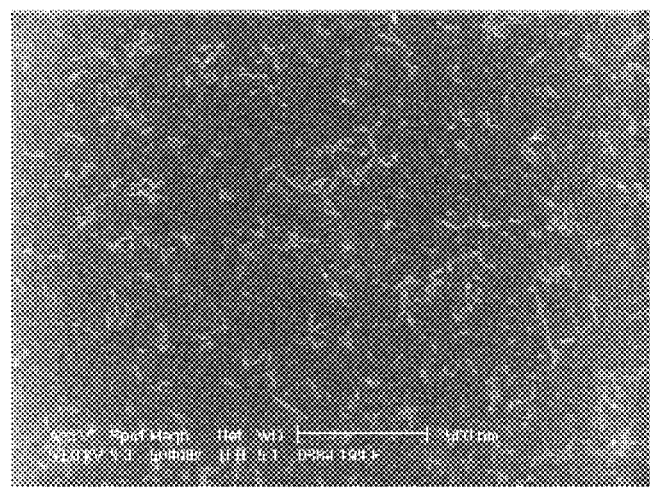
FIG. 10C is an SEM depicting a nanotube fabric formed with the fifth exemplary nanotube application solution described in relation to FIG. 10A after 2 hours of centrifugation.

FIG. 10B is an SEM image 1002 showing a nanotube fabric formed from the initial solution detailed in curve 1010 of FIG. 10A. FIG. 10C is an SEM image 1003 showing a nanotube fabric formed with a sample of the final adjusted nanotube solution detailed in curve 1020 of FIG. 10A. As discussed above, the mean length of nanotube elements in the adjusted length fabric in SEM image 1003 is approximately half that of the unadjusted nanotube fabric in SEM image 1002.

Figure 11A:
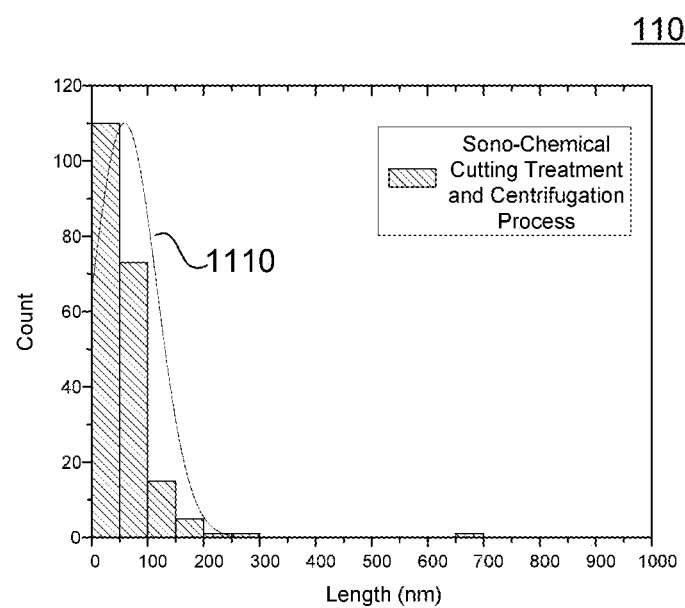
FIG. 11A is a plot showing the nanotube length distribution profile of a sixth exemplary nanotube application solution after a sono-chemical cutting process and a centrifugation process.

FIG. 11A is a plot 1101 detailing the results of a sixth exemplary nanotube length distribution adjustment process according to the methods of the present disclosure. The nanotube length distribution adjustment process detailed in FIG. 11A uses combination of a sono-chemical cutting process and a centrifugation process to adjust the nanotube length distribution within a nanotube application solution.

Referring to curve 1110, an initial suspension of nanotube elements was sonicated in a sulfuric-nitric mix for twenty-four hours (24 hrs). The sonication process was then followed by a reflux in a 20% nitric solution for 1.5 hours (the refluxing step used to remove impurities in the solution). The nanotube elements were then processed through a repeated centrifugation process wherein the first two centrifugation runs were for twenty minutes (20 mins) each and the last run was for two hours (2 hrs). The supernatant solution from the final centrifugation step was then used to form a nanotube fabric layer, and that fabric analyzed to provide curve 1110. As shown in curve 1110, the mean nanotube length within the twenty-four hour sonicated solution was adjusted to 59 nm with a standard deviation of 58 nm and a median length of 45 nm. Within the exemplary process detailed in FIG. 11A, a mean nanotube length of the order of 60 nm and a median nanotube length on the order of 45 nm was realized with a combined sono-chemical cutting and centrifugation process step. Further processing using one or a combination of methods of the present disclosure (described further above) can reduce the average and/or the median of the nanotube length distribution to less than 10 nm.

Figure 11B:
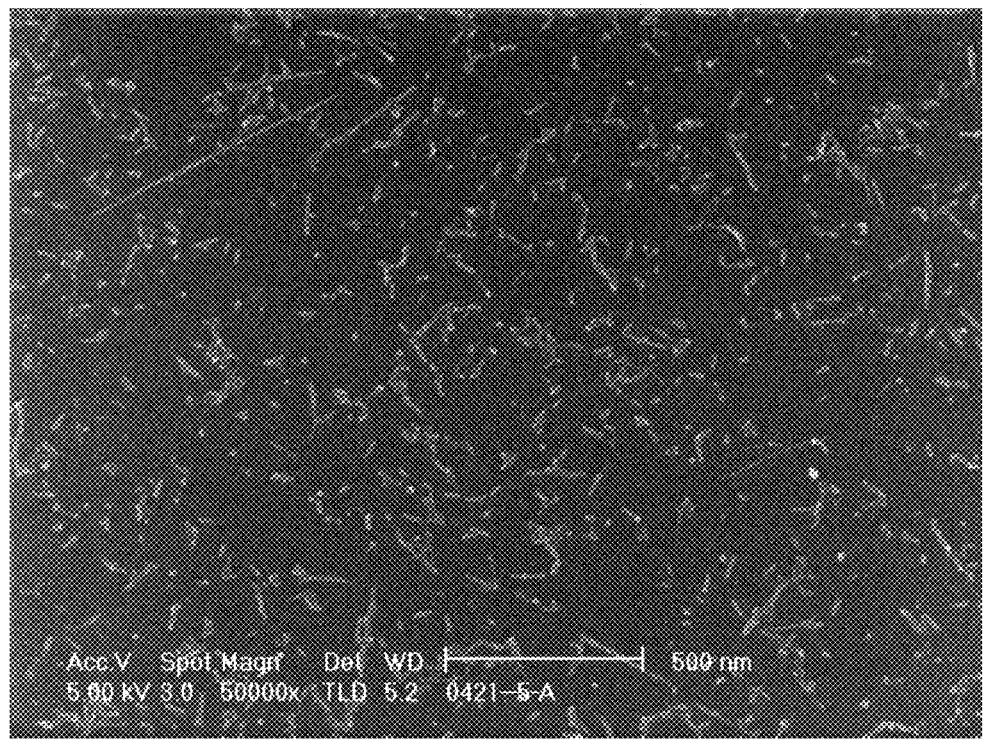
FIG. 11B is an SEM depicting a nanotube fabric formed with the sixth exemplary nanotube application solution described in relation to FIG. 11A (after the adjustment process)

FIG. 11B is an SEM image 1102 showing a nanotube fabric formed with a sample of the final adjusted solution detailed in curve 1110 of FIG. 11A. As discussed above, the mean length of nanotube elements in the SEM image 1102 is 59 nm.

It should be noted that while the preceding examples show the methods of the present disclosure (filtering and sono-chemical cutting) being used separately, the methods of the present disclosure are not limited in this regard. Indeed, within certain applications one or more filtering processes can be used with one or more sono-chemical cutting processes in concert to adjust the nanotube length distribution of a nanotube application solution to conform to a preselected or desired nanotube length distribution profile. Further, it should also be noted that the methods of the present disclosure can be used with nanotube application solution purification processes (as detailed in the incorporated references) to provide highly pure, low defect nanotube solutions and fabrics that comprise nanotube length distribution profiles that confirm to predetermined design parameters.

Figure 12:
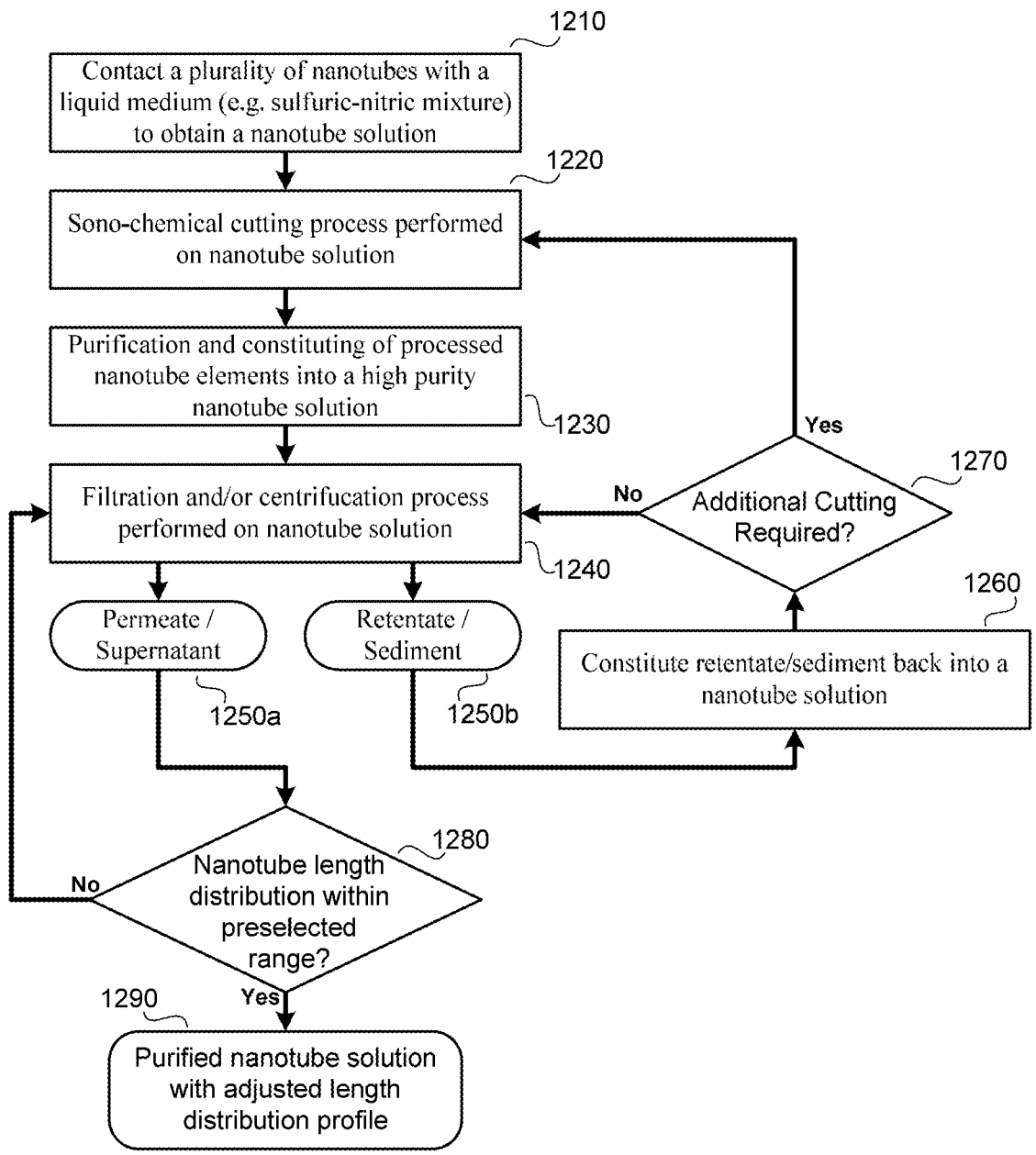
FIG. 12 is a flow chart depicting an exemplary nanotube length distribution adjustment process using a combination of the methods described in the present disclosure.

To this end, FIG. 12 is a flow chart detailing an exemplary nanotube length distribution adjustment process 1201 that provides a highly pure and stable nanotube application solution with a desired length distribution profile. This non-limiting example is intended to illustrate how the methods of the present disclosure can be used together and with other purification techniques (as described further in the incorporated references) to adjust the nanotube length distribution of a nanotube application solution.

In a first process step 1210, a plurality of nanotubes is combined with a liquid medium (such as, but not limited to, a sulfuric-nitric mixture or water) to realize a nanotube application solution. In a next process step 1220, the application solution realized in process step 1210 is subjected to a sono-chemical cutting process (as is described in detail above) to reduce the length of the nanotube elements within the solution. In a next process step 1230, the sono-chemical cut nanotubes are purified and constituted back into a nanotube application solution. This purification step 1230 can include a number of steps such as, but not limited to, nitric acid functionalization, cross flow filtration (CFF) to remove amorphous carbon, ion-exchange to remove metal ions, and centrifugation to remove particulate impurities. These purification steps can also be repeated as is required by a specific application to render the adjusted nanotube elements back into a pure and stable nanotube application solution.

In a next process step 1240, a filtering process and/or a centrifugation process is used to separate relatively long nanotube elements from the solution formed and purified in process step 1230. As previously discussed, different filtering processes (such as, but not limited to depth filters and membrane filters) can be used within process step 1240. A centrifugation step can also be performed in place of a filtering process or, within certain applications, in series with one or more filtering processes. In this way, the filtering/centrifugation process step 1240 separates the nanotube solution into a permeate/supernatant component 1250a (that part of the nanotube solution that passes through the filter element and/or remains above the residue formed via the centrifugation process, essentially the shorter nanotube elements) and a retentate/sediment component 1250b (that part of the nanotube solution that is retained within the filter element and/or the residue formed via the centrifugation process, essentially the longer nanotube elements). In process step 1260, the retentate/sediment 1250b is constituted back into a nanotube solution, and then analyzed (in process step 1270) to determine if further sono-chemical cutting is required (if the retentate/sediment still comprises a significantly large percentage of relatively long nanotubes, for example). The retentate solution is then looped back to process step 1220 (if further sono-chemical cutting is required) or process step 1240 (if further sono-chemical cutting is not required), and the process continues. While not show in FIG. 12, it should be noted that in certain applications it can be advantageous when further sono-chemical cutting is required to first return the retentate solution back to process step 1210 prior to the further sono-chemical cutting (process step 1220).

Within process step 1280, the permeate/supernatant 1250a realized from filtering/centrifugation process step 1240 is analyzed to determine the resultant nanotube length distribution. If the distribution is within a predetermined and/or desired range (conforms to a desired profile) or design parameter, the process ends with step 1290 as the desired nanotube application solution has been realized. However, if the desired profile has not been realized, the process loops back to send the permeate 1250a through another filtration/centrifugation process (step 1240) to further adjust the length distribution. The nanotube application solution is then analyzed again (process step 1280) and the filtering/centrifugation step 1240 repeated until the desired nanotube length distribution profile has been realized.

Again, it should be noted that the exemplary process detailed in FIG. 12 is only one example of how the methods of the present disclosure can be combined and used to adjust the nanotube length distribution of a nanotube application solution. However, the methods of the present disclosure are not limited in this regard. Indeed, in one example an additional purification process step could be used between steps 1210 (the forming of the initial solution) and 1220 (the sono-chemical cutting process) such that the solution is purified prior to the sono-chemical cutting process. In another example, a "no" result at process step 1280 (indicating that the nanotube length distribution had not yet been adjusted into the preselected range) could direct the process to a second sono-chemical cutting process step (instead of into filtering/centrifugation process step 1240). In another example a filtering and/or centrifugation process step can take place prior to the any sono-chemical cutting process steps. In another example a process might only include filtering processes to adjust the nanotube length distribution. In another example a process might only include a sono-chemical cutting processes to adjust the nanotube length distribution. In another example a process might only include only centrifugation processes to adjust the nanotube length distribution. Indeed, it will be clear to those skilled in the art that these methods can be selected, combined, and repeated as described within the present disclosure as best befits the needs of a specific application. As such, the methods of the present disclosure should not be limited to a specific recitation of process steps (as is detailed, for example, in the exemplary process of FIG. 12).

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

What is claimed is:

1. A method for forming a scalable nanotube fabric comprising:

contacting a plurality of nanotubes with a liquid medium to obtain a nanotube solution;

performing at least one nanotube length distribution adjustment process on said nanotube solution;

depositing said nanotube solution over a material layer to form a nanotube fabric layer, wherein at least one of said at least one nanotube length distribution adjustment processes is a sono-chemical cutting process, and wherein a gas pressure used within said sono-chemical cutting process is selected from within the range between a vapor pressure of water and one atmosphere (1 ATM), and wherein the gas pressure is selected by bubbling a gas through said nanotube solution during said sono-chemical cutting process.

2. The method of claim 1 wherein said at least one nanotube length distribution adjustment processes additionally includes a filtering process.

3. The method of claim 2 wherein said filtering process adjusts the mean nanotube length within a filtered nanotube solution to within a range between 5 nm and 5 µm.

4. The method of claim 1 wherein said sono-chemical cutting process adjusts the mean nanotube length within a filtered/centrifugated/chemical treated nanotube solution to a range between 5 nm and 5 µm.

5. The method of claim 1 wherein said sono-chemical cutting process uses a sulfuric acid-nitric acid mixture.

6. The method of claim 1 wherein said gas is one of argon, xenon, ozone, and $H_2O_2$.

7. The method of claim 1 wherein said at least one nanotube length distribution adjustment processes additionally includes a centrifugation process.

8. The method of claim 1 wherein said plurality of nanotubes are carbon nanotubes.

* * * * *